US009680469B1

(12) United States Patent
Tan et al.

(10) Patent No.: US 9,680,469 B1
(45) Date of Patent: *Jun. 13, 2017

(54) CIRCUITS AND METHODS FOR IMPEDANCE CALIBRATION

(71) Applicant: Altera Corporation, San Jose, CA (US)

(72) Inventors: Kok Siang Tan, Bayan Lepas (MY); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/156,309

(22) Filed: May 16, 2016

Related U.S. Application Data

(63) Continuation of application No. 14/461,048, filed on Aug. 15, 2014, now Pat. No. 9,369,128.

(51) Int. Cl.
*H03K 19/16* (2006.01)
*H03K 19/00* (2006.01)
*H03K 17/687* (2006.01)

(52) U.S. Cl.
CPC ....... *H03K 19/0005* (2013.01); *H03K 17/687* (2013.01)

(58) Field of Classification Search
CPC ............ H03K 19/0005; H04L 25/0278; H04L 25/028
See application file for complete search history.

(56) References Cited

U.S. PATENT DOCUMENTS

| 6,489,837 | B2 | 12/2002 | Schultz et al. | |
| 7,372,295 | B1 | 5/2008 | Wei | |
| 7,420,386 | B2 | 9/2008 | Wang et al. | |
| 7,423,450 | B2 | 9/2008 | Santurkar et al. | |
| 7,443,193 | B1 | 10/2008 | Santurkar et al. | |
| 7,973,553 | B1 * | 7/2011 | Wang | H04L 25/0278 326/30 |
| 8,446,169 | B1 * | 5/2013 | Marlett | H04L 25/0278 326/30 |
| 8,581,619 | B2 | 11/2013 | Singh et al. | |
| 8,618,843 | B2 * | 12/2013 | Liu | H03K 19/0005 327/108 |
| 8,669,792 | B2 * | 3/2014 | Rao | H04L 25/0274 326/83 |
| 9,369,128 | B1 * | 6/2016 | Tan | H03K 19/0005 |

(Continued)

*Primary Examiner* — Alexander H Taningco
*Assistant Examiner* — Kurtis R Bahr
(74) *Attorney, Agent, or Firm* — Steven J. Cahill

(57) ABSTRACT

A driver circuit drives data to an output based on an input data signal in a transmission mode. The driver circuit includes transistors. A comparator generates a comparison output in a calibration mode based on a reference signal and a signal at the output of the driver circuit. A calibration control circuit adjusts an equivalent resistance of the transistors in the driver circuit based on the comparison output in the calibration mode. The equivalent resistance of the transistors in the driver circuit can be adjusted to support the transmission of data according to multiple different data transmission protocols using transmission links having different characteristic impedances. The equivalent resistance of the transistors in the driver circuit can also be adjusted to compensate for resistance in the package routing conductors and/or to compensate for parasitic resistance.

20 Claims, 9 Drawing Sheets

(56) References Cited

U.S. PATENT DOCUMENTS

| | | | |
|---|---|---|---|
| 2008/0088338 A1* | 4/2008 | Kim | G11C 29/02 326/30 |
| 2010/0271144 A1* | 10/2010 | McCorquodale | H03B 5/04 331/117 FE |
| 2012/0212254 A1* | 8/2012 | Yokou | G11C 29/028 326/30 |
| 2013/0113517 A1* | 5/2013 | Ko | H03K 19/0005 326/30 |
| 2013/0154689 A1 | 6/2013 | Shon | |
| 2014/0368272 A1* | 12/2014 | Wang | H03K 19/01858 330/260 |
| 2015/0070086 A1* | 3/2015 | Tan | G05F 3/16 327/540 |

\* cited by examiner

CIRCUITS AND METHODS FOR IMPEDANCE CALIBRATION

CROSS REFERENCE TO RELATED APPLICATION

This patent application is a continuation of U.S. patent application Ser. No. 14/461,048, filed Aug. 15, 2014, which is incorporated by reference herein in its entirety.

FIELD OF THE DISCLOSURE

The present disclosure relates to electronic circuits, and more particularly, to circuits and methods for impedance calibration.

BACKGROUND

In a data transmission system, one or more signals are transmitted from a transmitter to a receiver through external transmission links. If the bit period of a transmitted signal is shorter than the transmission time of the transmitted signal, as in high speed transmission links, reflections of the transmitted signal may arrive at the receiver with the main transmitted signal. The signal reflections may corrupt the transmitted signal received by the receiver, causing loss of the transmitted data.

BRIEF SUMMARY

According to some embodiments, a driver circuit drives data to an output based on an input data signal in a transmission mode. The driver circuit includes transistors. A comparator generates a comparison output in a calibration mode based on a reference signal and a signal at the output of the driver circuit. A calibration control circuit adjusts an equivalent resistance of the transistors in the driver circuit based on the comparison output in the calibration mode.

Various objects, features, and advantages of the present invention will become apparent upon consideration of the following detailed description and the accompanying drawings.

DETAILED DESCRIPTION

Figure 1:
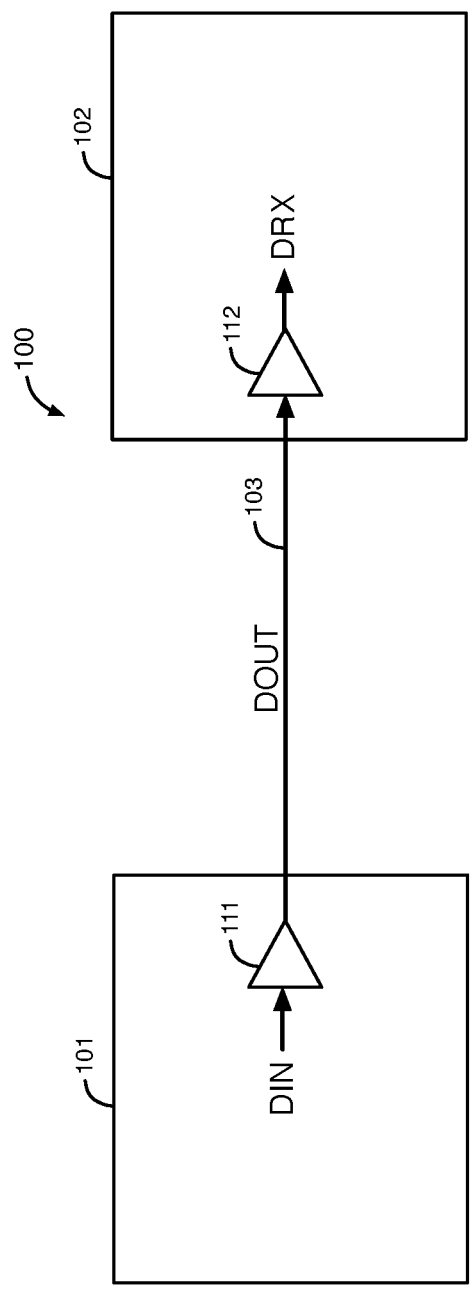
FIG. 1 illustrates an example of a data transmission system, according to an embodiment of the present invention.

The output resistance of a driver circuit in a transmitter is selected to match the characteristic impedance of the transmission link coupled to the output of the driver circuit in order to reduce or eliminate signal reflections in the transmission link. If the output resistance of the driver circuit does not match the characteristic impedance of the transmission link, a reflected signal wave may be generated in the transmission link that causes loss in a signal transmitted by the driver circuit through the transmission link. It is therefore desirable to reduce or avoid mismatch between the output resistance of a driver circuit in a transmitter and the characteristic impedance of a transmission link in order to preserve the integrity of a signal that the driver circuit transmits through the transmission link.

The output resistance of a driver circuit in a transmitter may be adjusted for a variety of reasons. For example, different data transmission protocols may use transmission links that have different characteristic impedances. If a transmitter is reconfigured to operate according to a different data transmission protocol that uses a transmission link with a different characteristic impedance, the output resistance of the driver circuit can be changed to match the different characteristic impedance. As a specific example, a first data transmission protocol may require a driver circuit to have an output resistance of 100 ohms, and a second data transmission protocol may require a driver circuit to have an output resistance of 85 ohms.

Resistance in the routing conductors within a package that houses an integrated circuit adds to the effective output resistance of a driver circuit in the integrated circuit. Also, parasitic resistance in a transmitter adds to the effective output resistance of a driver circuit in the transmitter. The output resistance of a driver circuit may be changed to compensate for the resistance in the package routing conductors and the parasitic resistance in the transmitter so that the effective output resistance of the driver circuit matches the characteristic impedance of the transmission link.

The output resistance of a driver circuit in a transmitter may vary in response to changes in the process, the supply voltage, or the temperature (PVT) of the transmitter. The output resistance of the driver circuit may be changed to compensate for PVT variations of the transmitter so that the output resistance of the driver circuit matches the characteristic impedance of the transmission link.

According to some embodiments disclosed herein, an impedance calibration circuit calibrates the output resistance of a driver circuit in a transmitter. The impedance calibration circuit may cause the output resistance of the driver circuit to match the characteristic impedance of a transmission link to reduce signal reflections in signals that are transmitted by the driver circuit through the transmission link. The impedance calibration circuit can, for example, adjust the output resistance of the driver circuit to compensate for PVT variations, to compensate for the resistance in the package routing conductors, and/or to compensate for parasitic resistance in the transmitter. The impedance calibration circuit can cause the output resistance of the driver circuit to match the characteristic impedance of the transmission link over a wide range of PVT variations.

The impedance calibration circuit can also adjust the output resistance of the driver circuit to match different characteristic impedances of transmission links used by different data transmission protocols. Thus, the impedance calibration circuit can adjust the output resistance of the driver circuit to support the transmission of data according to multiple different data transmission protocols using transmission links having different characteristic impedances.

FIG. 1 illustrates an example of a data transmission system 100, according to an embodiment of the present invention. Data transmission system 100 includes a first integrated circuit 101, a second integrated circuit 102, and a transmission link 103. Integrated circuit 101 includes a transmitter circuit 111. Integrated circuit 102 includes a receiver circuit 112. Transmission link 103 has conductors and connectors including one or more transmission lines and a pad on each integrated circuit 101-102.

Transmitter circuit 111 receives an input data signal DIN indicating digital bits received from inside integrated circuit 101. Transmitter circuit 111 generates an output data signal DOUT based on the input data signal DIN. Transmitter circuit 111 causes output data signal DOUT to indicate the same sequence of bits as data signal DIN. Data signal DOUT is transmitted through transmission link 103 to an input of receiver circuit 112. Receiver circuit 112 generates a data signal DRX based on the data signal DOUT received from the transmission link 103. Receiver circuit 112 causes data signal DRX to indicate the same sequence of bits as data signal DOUT. Transmitter circuit 111 and data signals DIN and DOUT may be single-ended or differential.

Figure 2:
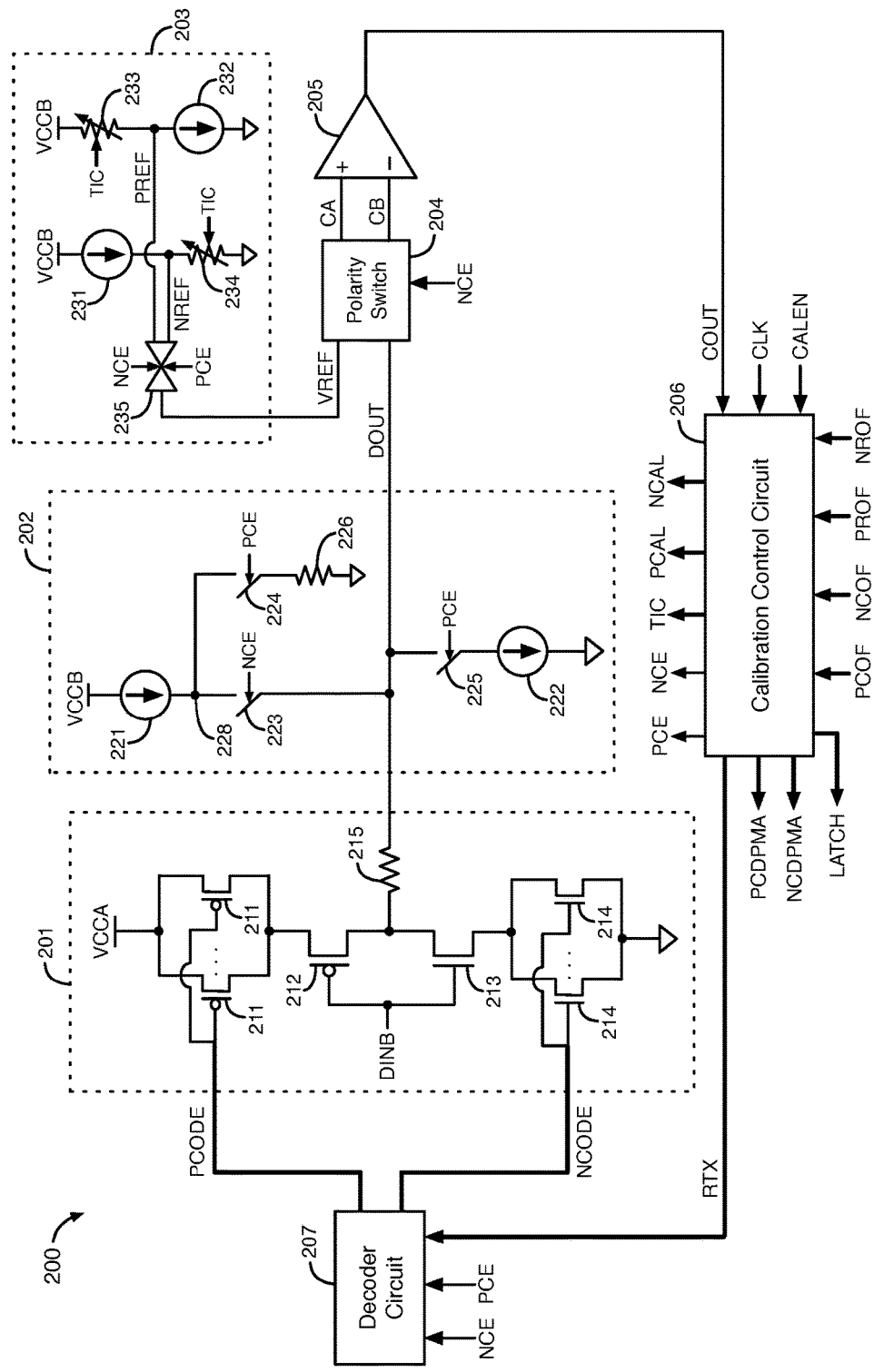
FIG. 2 illustrates an example of an impedance calibration circuit, according to an embodiment of the present invention.

FIG. 2 illustrates an example of an impedance calibration circuit 200, according to an embodiment of the present invention. The impedance calibration circuit 200 includes driver circuit 201, calibration current circuit 202, reference voltage generator circuit 203, polarity switch circuit 204, comparator circuit 205, calibration control circuit 206, and decoder circuit 207. The impedance calibration circuit 200 calibrates the equivalent resistances of transistors in driver circuit 201.

Driver circuit 201 may be part of transmitter circuit 111 in a data channel. The transmitter circuit 111 may be coupled to a transmission link 103, as shown in FIG. 1. The transmitter circuit and impedance calibration circuit 200 may be in a single integrated circuit 101. Integrated circuit 101 may be any type of integrated circuit.

In the embodiment of FIG. 2, driver circuit 201 is a voltage mode driver circuit. As a voltage mode driver circuit, driver circuit 201 typically consumes less power than a current mode driver circuit, such as a current mode logic driver circuit.

Driver circuit 201 includes two or more p-channel field-effect transistors (FETs) 211, p-channel FET 212, n-channel FET 213, two or more n-channel FETs 214, and resistor 215. P-channel transistors 211 are coupled together in parallel between a node at a first supply voltage VCCA and the source of transistor 212. N-channel transistors 214 are coupled together in parallel between a node at a ground voltage and the source of transistor 213.

An input signal DINB is provided to the gates of transistors 212 and 213. A first terminal of resistor 215 is coupled to the drains of transistors 212 and 213. The output signal DOUT is generated at the second terminal of resistor 215, which is the output of the driver circuit 201. A transmission link may be coupled to the output of driver circuit 201.

Driver circuit 201 operates in a calibration mode and in a transmission mode during different periods of time. During the calibration mode, impedance calibration circuit 200 adjusts the output resistance of driver circuit 201 according to a reference voltage VREF generated by the reference voltage generator circuit 203. The output resistance of driver circuit 201 is based on the equivalent resistances of transistors 211 and 214 and on resistor 215. Calibration control circuit 206 generates signals RTX for controlling the equivalent resistances of transistors 211 and 214 during the calibration mode. Calibration control circuit 206 generates signal DINB during the calibration mode. Calibration control circuit 206 also generates control signals PCDPMA, NCDPMA, LATCH, PCE, NCE, TIC, PCAL, and NCAL. Calibration control circuit 206 receives signals COUT, CLK, CALEN, PCOF, NCOF, PROF, and NROF at inputs. Further details of the calibration mode are described below with respect to FIGS. 5A-5B and 6.

During the transmission mode, signal DINB is generated based on an input data signal DIN, and driver circuit 201 functions as a buffer circuit to buffer signal DINB to generate an output data signal DOUT. During transmission mode, the equivalent resistances of transistors 211 and 214 are set to the resistance values that were generated during a previous calibration mode.

Figure 3:
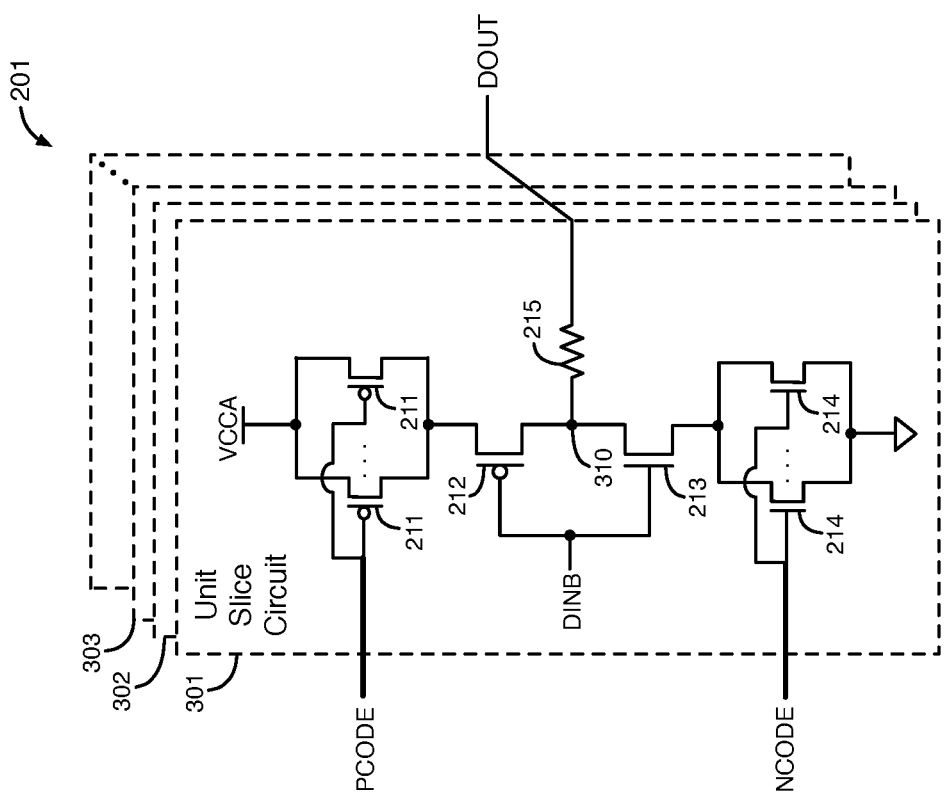
FIG. 3 illustrates further details of the driver circuit of FIG. 2, according to an embodiment of the present invention.

FIG. 3 illustrates further details of driver circuit 201, according to an embodiment of the present invention. In the embodiment of FIG. 3, driver circuit 201 includes multiple unit slice circuits, including exemplary unit slice circuits 301, 302, and 303. Driver circuit 201 may include any number of unit slice circuits. As shown in FIG. 3, unit slice circuit 301 includes p-channel FETs 211, p-channel FET 212, n-channel FET 213, n-channel FETs 214, and resistor 215. Each of the other unit slice circuits 302, 303, etc. in driver circuit 201 includes a set of transistors 211-214 and a resistor 215 that are coupled as shown in FIG. 3 for unit slice circuit 301. Thus, each of the unit slice circuits 301, 302, 303, etc. in driver circuit 201 includes a copy of the circuit architecture that is shown for unit slice circuit 301 in FIG. 3. The outputs of the unit slice circuits in driver circuit 201 are coupled together at a node at each resistor 215 where output data signal DOUT is generated, as shown in FIG. 3.

During the transmission mode of driver circuit 201, the unit slice circuits 301, 302, 303, etc. in driver circuit 201 buffer bits received in an input data signal DIN (shown in FIG. 1) to generate bits in output data signal DOUT. The unit slice circuits in driver circuit 201 invert the polarity of the bits in output data signal DOUT relative to the bits in the input data signals received at the gates of transistors 212-213. The polarity of the input data signal received at the gates of transistors 212-213 (e.g., signal DINB) in each unit slice circuit is inverted relative to the polarity of input data signal DIN, so that the bits in output data signal DOUT have the same polarity as the bits in input data signal DIN.

During the transmission mode of driver circuit 201, unit slice circuit 301 generates data signal DOUT by buffering and inverting the bits in input data signal DINB. Input data signal DINB may be generated by inverting and delaying input data signal DIN by one or more unit intervals in the transmission mode. The other unit slice circuits 302, 303, etc. in driver circuit 201 may generate data signal DOUT by buffering and inverting other input data signals during the transmission mode. These other input data signals may be generated by inverting and delaying input data signal DIN by different delays or by the same delay to provide pre-emphasis and/or de-emphasis to data signal DOUT. Pre-emphasis and/or de-emphasis is provided to data signal DOUT to reduce inter-symbol interference (ISI) that may be introduced into data signal DOUT in the transmission link.

The unit slice circuit 301 shown in FIG. 3 is merely one example of a circuit architecture for the unit slice circuits in driver circuit 201. According to another embodiment, resistor 215 is eliminated in each of the unit slice circuits in driver circuit 201, and the drains of transistors 212-213 at node 310 in each unit slice circuit in driver circuit 201 are coupled to the output of driver circuit 201.

According to other embodiments, one or more passive resistors are coupled between the drain of transistor 212 and node 310 in each of the unit slice circuits in driver circuit 201, and one or more passive resistors are coupled between the drain of transistor 213 and node 310 in each of the unit slice circuits in driver circuit 201. These embodiments may or may not include resistor 215 in each of the unit slice circuits.

According to yet another embodiment, transistors 211 and transistors 214 are eliminated from each of the unit slice circuits in driver circuit 201, the source of transistor 212 is coupled directly to the node at supply voltage VCCA, and the source of transistor 213 is coupled directly to the node at the ground voltage. In these embodiments, the output resistance of driver circuit 201 is adjusted by changing the number of the unit slice circuits that are enabled in driver circuit 201 to drive data to the output. These embodiments may or may not include resistor 215 in each of the unit slice circuits.

Referring again to FIG. 2, the output of driver circuit 201 is coupled to calibration current circuit 202. Calibration current circuit 202 includes constant current source circuits 221 and 222, switch circuits 223-225, and resistor 226. Constant current source circuit 221 generates a constant current that remains the same over variations in the process and the temperature of impedance calibration circuit 200. Constant current source circuit 222 generates a constant current that remains the same over variations in the process and the temperature of impedance calibration circuit 200. Constant current source circuit 222 generates the same constant current as current source circuit 221. One or both of constant current source circuits 221 and 222 may generate constant current using a bandgap reference voltage generator circuit.

Constant current source circuit 221 is coupled between a node at a second supply voltage VCCB and switch circuits 223-224. Supply voltage VCCB may, for example, be greater than supply voltage VCCA. Switch circuits 223 and 225 are coupled to the output of driver circuit 201. Constant current source circuit 222 is coupled between a node at the ground voltage and switch circuit 225. Resistor 226 is coupled between a node at the ground voltage and switch circuit 224. Each of the switch circuits 223-225 and each of the other switch circuits disclosed herein may, for example, be implemented by one or more transistors.

Calibration control circuit 206 generates control signals NCE and PCE. Calibration control circuit 206 may, for example, control the logic states of signals NCE and PCE based on the state of a finite state machine. The conductive state of switch circuit 223 is controlled by control signal NCE. The conductive state of switch circuit 224 is controlled by control signal PCE. Control signal PCE has the inverse digital value of control signal NCE. The conductive state of switch circuit 225 is controlled by control signal PCE.

In response to control signal PCE being asserted, switch circuits 224 and 225 are in low impedance conductive states (i.e., are closed). When control signal PCE is asserted, control signal NCE is de-asserted. In response to control signal NCE being de-asserted, switch circuit 223 is in a high impedance non-conductive state (i.e., is open). Control signals PCE and NCE determine when the impedance calibration circuit 200 calibrates transistors 211 and 214. When control signal PCE is asserted, and control signal NCE is de-asserted, the impedance calibration circuit 200 calibrates the equivalent resistance of p-channel transistors 211.

In response to control signal NCE being asserted, switch circuit 223 is in a low impedance conductive state (i.e., is closed). When control signal NCE is asserted, control signal PCE is de-asserted. In response to control signal PCE being de-asserted, switch circuits 224-225 are in high impedance non-conductive states (i.e., are open). When control signal NCE is asserted, and control signal PCE is de-asserted, the impedance calibration circuit 200 calibrates the equivalent resistance of n-channel transistors 214. Further details of the calibration of transistors 211 and 214 are described below with respect to FIGS. 5A-5B and 6.

In the embodiment of FIG. 2, reference voltage generator circuit 203 includes current source circuits 231-232, adjustable resistance circuits 233-234, and pass gate circuit 235. Current source circuit 231 is coupled between a node at the second supply voltage VCCB and a node that is coupled to a first terminal of adjustable resistance circuit 234 and a first input of pass gate circuit 235. The second terminal of adjustable resistance circuit 234 is coupled to a node at the ground voltage. Current source circuit 232 is coupled between a node at the ground voltage and a node that is coupled to a first terminal of adjustable resistance circuit 233 and a second input of pass gate circuit 235. The second terminal of adjustable resistance circuit 233 is coupled to a node at the second supply voltage VCCB. Calibration control circuit 206 generates one or more control signals TIC that control the resistances of adjustable resistance circuits 233-234.

Each of the current source circuits 231 and 232 generates a tracking current that varies with changes in the temperature and the process of impedance calibration circuit 200. Current source circuits 231-232 may generate their tracking currents using the bandgap reference voltage generator circuit. Current source circuits 231-232 may be part of the bandgap reference voltage generator circuit or separate circuits. The bandgap reference voltage generator circuit generates a bandgap voltage. The bandgap voltage is constant over changes in the temperature and the process of impedance calibration circuit 200. The bandgap voltage is generated using a voltage divider that includes a resistor R. Because the resistance of the resistor R varies with process and temperature, the tracking current I generated by each of current source circuits 231 and 232 varies with the temperature and the process of impedance calibration circuit 200, such that I=V/R, where V is the constant bandgap voltage.

Figure 4:
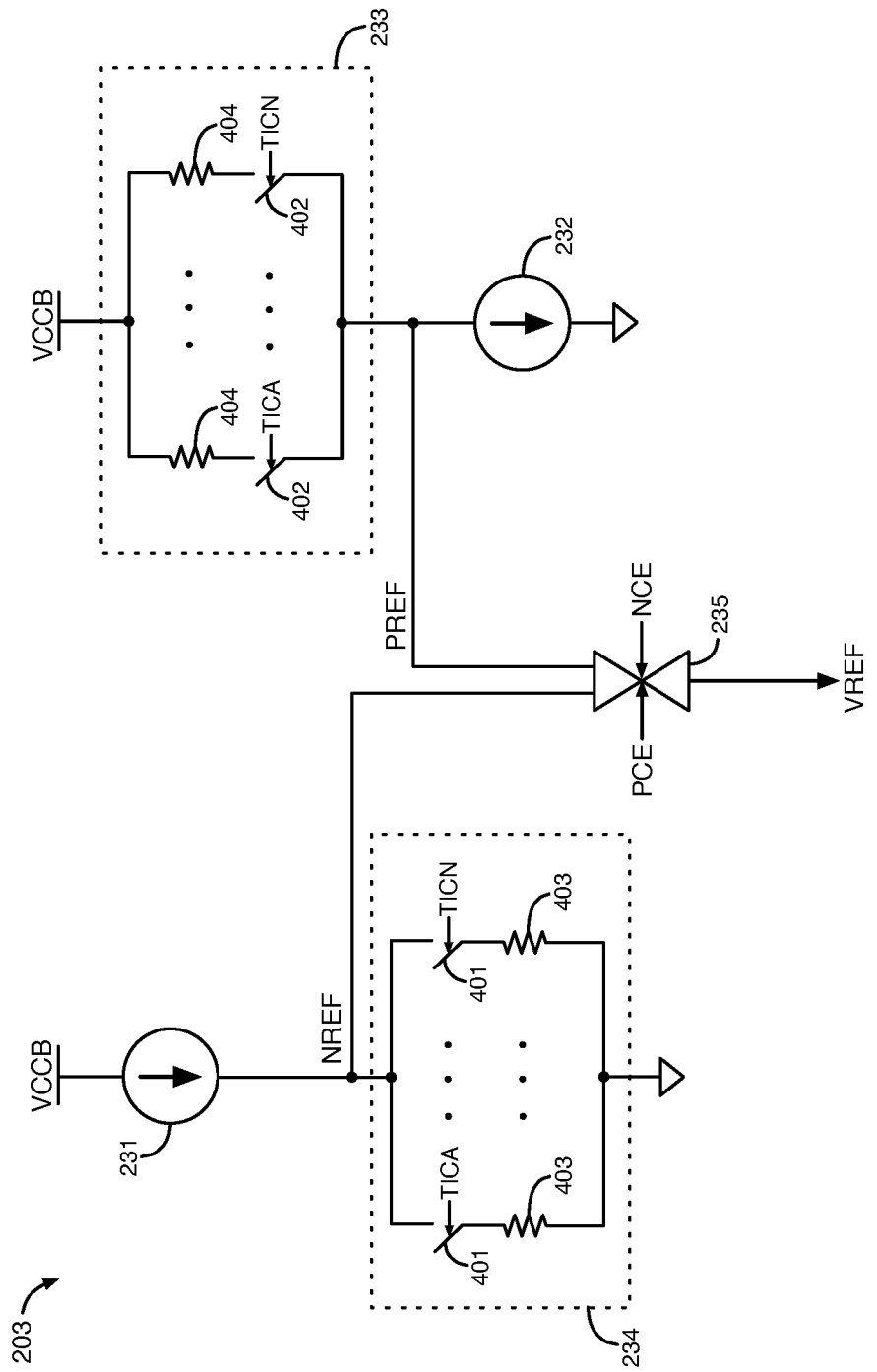
FIG. 4 illustrates an exemplary embodiment of the reference voltage generator circuit of FIG. 2, according to an embodiment of the present invention.

FIG. 4 illustrates an exemplary embodiment of reference voltage generator circuit 203, according to an embodiment of the present invention. In the embodiment of FIG. 4, reference voltage generator circuit 203 includes current source circuits 231-232, pass gate circuit 235, switch circuits 401, switch circuits 402, resistors 403, and resistors 404. Each of the switch circuits 401 and each of the switch circuits 402 may include one or more transistors. Pass gate circuit 235 may include multiple transistors.

In the embodiment of FIG. 4, switch circuits 401 and resistors 403 are used to implement adjustable resistance circuit 234. Reference voltage generator circuit 203 has two or more of resistors 403 and an equal number of switch circuits 401. Each of the resistors 403 is coupled in series with a paired one of the switch circuits 401 between current source circuit 231 and a node at the ground voltage. The pairs of resistors 403 and switch circuits 401 are coupled in parallel as shown in FIG. 4. Each of the resistors 403 has the same resistance at a given temperature of circuit 203.

In the embodiment of FIG. 4, switch circuits 402 and resistors 404 are used to implement adjustable resistance circuit 233. Reference voltage generator circuit 203 has two or more of resistors 404 and an equal number of switch circuits 402. Each of the resistors 404 is coupled in series with a paired one of the switch circuits 402 between a node at supply voltage VCCB and current source circuit 232. The pairs of resistors 404 and switch circuits 402 are coupled in parallel as shown in FIG. 4. Each of the resistors 404 has the same resistance at a given temperature of circuit 203.

Two or more control signals TICA-TICN control the conductive states of switch circuits 401 and switch circuits 402. Control signals TICA-TICN shown in FIG. 4 are examples of control signals TIC shown in FIG. 2. Each of the control signals TICA-TICN controls the conductive state of one of switch circuits 401 and one of switch circuits 402. The resistances of the adjustable resistance circuits 233 and 234 are decreased by making changes in the logic states of control signals TICA-TICN that close (i.e., turn on) more of switch circuits 402 and 401, respectively. Closing more of switch circuits 402 and 401 causes more of resistors 404 and 403 to be coupled in parallel, which decreases the equivalent resistances of adjustable resistance circuits 233 and 234, respectively. The resistances of the adjustable resistance circuits 233 and 234 are increased by making changes in the logic states of control signals TICA-TICN that open (i.e., turn off) more of switch circuits 402 and 401, respectively. Opening more of switch circuits 402 and 401 reduces the number of the resistors 404 and 403 that are coupled in parallel, which increases the equivalent resistances of adjustable resistance circuits 233 and 234, respectively.

A first reference voltage NREF is generated at the node between current source circuit 231 and switch circuits 401. The node between current source circuit 231 and switch circuits 401 is coupled to a first input of pass gate circuit 235. A second reference voltage PREF is generated at the node between current source circuit 232 and switch circuits 402. The node between current source circuit 232 and switch circuits 402 is coupled to a second input of pass gate circuit 235.

Impedance calibration circuit 200 calibrates the equivalent resistance of p-channel transistors 211 to a desired resistance value based on the resistance of adjustable resistance circuit 233. Impedance calibration circuit 200 calibrates the equivalent resistance of n-channel transistors 214 to a desired resistance value based on the resistance of adjustable resistance circuit 234. Further details of the calibration of transistors 211 and 214 are described below.

The circuits in adjustable resistance circuit 233, including resistors 404 and switch circuits 402, are in the same integrated circuit as the other circuitry in impedance calibration circuit 200. The circuits in adjustable resistance circuit 234, including resistors 403 and switch circuits 401, are in the same integrated circuit as the other circuitry in impedance calibration circuit 200. Thus, resistors 403 and 404 are on-die resistors. Because adjustable resistance circuits 233-234 are in the same integrated circuit as the other circuitry in impedance calibration circuit 200, external resistors and signal bumps are not needed to perform the calibration of transistors 211 and 214.

The resistances of the adjustable resistance circuits 233 and 234 are adjusted by changing the logic states of control signals TICA-TICN, as described above. The resistances of the adjustable resistance circuits 233 and 234 may be adjusted to change reference voltages PREF and NREF, respectively. The reference voltages PREF and NREF are changed in order to calibrate the equivalent resistances of transistors 211 and 214, respectively, to different resistance values. For example, the reference voltages PREF and NREF can be set to voltages that cause the impedance calibration circuit 200 to calibrate the equivalent resistances of transistors 211 and 214, respectively, to generate an output resistance of 50 ohms in driver circuit 201 during a first calibration mode. The reference voltages PREF and NREF can subsequently be changed to voltages that cause the impedance calibration circuit 200 to calibrate the equivalent resistances of transistors 211 and 214, respectively, to generate an output resistance of 42.5 ohms in driver circuit 201 during a second calibration mode. In some embodiments, the reference voltages NREF and PREF generated by reference voltage generator circuit 203 can be changed by small amounts to compensate for any offsets that affect the resistance in the transmitter or in the transmission link. For example, the reference voltages PREF and NREF can be changed to voltages that cause the impedance calibration circuit 200 to calibrate the equivalent resistances of transistors 211 and 214, respectively, to generate an output resistance in driver circuit 201 of 48 ohms, instead of 50 ohms, during the first calibration mode.

In an embodiment, each of the resistors 403 is a passive resistor that has a width and a length, and the resistor R1 that is used to generate the current sourced by current source circuit 231 is a passive resistor having a width and a length. In an embodiment, the width of each of resistors 403 is the same as the width of the resistor R1. As a result, the resistance of each of resistors 403 changes by the same percentage as the resistance of resistor R1 over variations in the temperature and the process of circuit 203. Current source circuit 231 varies its tracking current to compensate for variations in the resistances of resistors 403 that are caused by process and temperature variations. The tracking current generated by current source circuit 231 is inversely proportional to variations in the resistances of resistors 403 that are caused by process and temperature variations. The tracking current of current source circuit 231 tracks variations in the resistances of resistors 403 over temperature and process. As a result, reference voltage NREF remains substantially constant in response to variations in the temperature and the process of circuit 203 for a particular set of values of signals TICA-TICN.

In an embodiment, each of the resistors 404 is a passive resistor that has a width and a length, and the resistor R2 that is used to generate the current sunk by current source circuit 232 is a passive resistor having a width and a length. In an embodiment, the width of each of the resistors 404 is the same as the width of the resistor R2. As a result, the resistance of each of resistors 404 changes by the same percentage as the resistance of the resistor R2 over variations in the temperature and the process of circuit 203. Current source circuit 232 varies its tracking current to compensate for variations in the resistances of resistors 404 that are caused by process and temperature variations. The tracking current generated by current source circuit 232 is inversely proportional to variations in the resistances of resistors 404 that are caused by process and temperature variations. The tracking current of current source circuit 232 tracks variations in the resistances of resistors 404 over temperature and process. As a result, reference voltage PREF remains substantially constant in response to variations in the temperature and the process of circuit 203 for a particular set of values of signals TICA-TICN.

Control signals PCE and NCE are provided to control inputs of pass gate circuit 235. Control signals PCE and NCE determine whether pass gate circuit 235 provides reference voltage NREF or reference voltage PREF to the output of reference voltage generator circuit 203 as reference voltage VREF. In response to control signal PCE being asserted and control signal NCE being de-asserted, pass gate circuit 235 provides reference voltage PREF as reference voltage VREF, such that voltage VREF equals or approximately equals voltage PREF. In response to control signal NCE being asserted and control signal PCE being de-asserted, pass gate circuit 235 provides reference voltage NREF as reference voltage VREF, such that voltage VREF equals or approximately equals voltage NREF. Control signals NCE and PCE are not asserted at the same time.

Referring again to FIG. 2, output signal DOUT and reference voltage VREF are provided to inputs of polarity switch circuit 204. Control signal NCE is provided to a control input of polarity switch circuit 204. Polarity switch circuit 204 generates output voltage signals CA and CB. In response to control signal NCE being de-asserted, polarity switch circuit 204 causes voltage CA to equal reference voltage VREF, and polarity switch circuit 204 causes voltage CB to equal the voltage of output signal DOUT. In response to control signal NCE being asserted, polarity switch circuit 204 causes voltage CA to equal the voltage of output signal DOUT, and polarity switch circuit 204 causes voltage CB to equal reference voltage VREF.

Voltage signals CA and CB are provided to the non-inverting and inverting inputs of comparator circuit 205, respectively. Comparator circuit 205 compares the voltages of signals CA and CB to generate an output comparison signal COUT. Comparator circuit 205 causes comparison signal COUT to be in a logic high state in response to the voltage of signal CA being greater than the voltage of signal CB. Comparator circuit 205 causes comparison signal COUT to be in a logic low state in response to the voltage of signal CA being less than the voltage of signal CB. According to an alternative embodiment, polarity switch circuit 204 may be replaced with a circuit that inverts the polarity of comparison signal COUT in response to one or both of control signals NCE and PCE.

Comparison signal COUT is provided to an input of calibration control circuit 206. Calibration control circuit 206 generates digital signals RTX, PCAL, NCAL, PCDPMA, NCDPMA, and LATCH based on comparison signal COUT. Signals RTX are provided to inputs of decoder circuit 207. Control signals PCE and NCE are provided from calibration control circuit 206 to additional inputs of decoder circuit 207. Decoder circuit 207 generates two sets of control code signals PCODE and NCODE based on signals RTX, control signal PCE, and control signal NCE.

Signals PCODE are provided to the gates of p-channel transistors 211. Each of the signals PCODE is provided to the gate of a different one of transistors 211. Signals PCODE control the conductive states of transistors 211. Signals NCODE are provided to the gates of n-channel transistors 214. Each of the signals NCODE is provided to the gate of a different one of transistors 214. Signals NCODE control the conductive states of transistors 214.

Further details of the operation of the impedance calibration circuit 200 during the calibration of the output resistance of driver circuit 201 are now described. One or more of the unit slice circuits in driver circuit 201 are enabled to perform the calibration of the output resistance of driver circuit 201. The calibration of the resistances of transistors 211 and 214 in driver circuit 201 is performed during the calibration mode.

In some embodiments, less than all of the unit slice circuits in driver circuit 201 are enabled during the calibration mode, and the remaining unit slice circuits in driver circuit 201 are disabled. All of the transistors 211 and 214 in the disabled unit slice circuits remain off during the calibration mode. Thus, if driver circuit 201 has an X number of unit slice circuits, a Y number of the unit slice circuits in driver circuit 201 may be enabled during the calibration mode, where Y is less than X. For example, if driver circuit 201 has 50 unit slice circuits, 5 of the unit slice circuits may be enabled, and the remaining 45 unit slice circuits may be disabled during the calibration mode. Each of the unit slice circuits in driver circuit 201 may be enabled or disabled during the calibration mode, for example, by decoder circuit 207. In these embodiments, all or less than all of the unit slice circuits in driver circuit 201 are enabled to transmit data to signal DOUT during the transmission mode. The output resistance of driver circuit 201 is based on the equivalent resistances of the transistors 211 and 214 and the resistance of the resistor 215 in the enabled unit slice circuits.

Disabling some of the unit slice circuits in driver circuit 201 during the calibration mode reduces the calibration current and the power consumption of the impedance calibration circuit 200. Also, if the calibration of driver circuit 201 is performed using only a subset of the unit slice circuits in driver circuit 201, the die area of impedance calibration circuit 200 may be reduced, because driver circuit 201 may have a smaller number of unit slice circuits. In addition, the parasitic resistance of driver circuit 201 is smaller when some of the unit slice circuits are disabled during the calibration mode.

In an exemplary embodiment, p-channel transistors 211 have binary weighted channel width-to-length (W/L) ratios, and n-channel transistors 214 have binary weighted channel W/L ratios. For example, the channel W/L ratios of 8 binary weighted transistors 211 may be 1×, 2×, 4×, 8×, 16×, 32×, 64×, and 128×, and the channel W/L ratios of 8 binary weighted transistors 214 may be 1×, 2×, 4×, 8×, 16×, 32×, 64×, and 128×. In this embodiment, the equivalent resistance of transistors 211 is based on the combined W/L ratio of the transistors 211 that are on, and the equivalent resistance of transistors 214 is based on the combined W/L ratio of the transistors 214 that are on. The equivalent resistance of transistors 211 is decreased by increasing the combined W/L ratio of the transistors 211 that are on. The equivalent resistance of transistors 211 is increased by decreasing the combined W/L ratio of the transistors 211 that are on. The equivalent resistance of transistors 214 is decreased by increasing the combined W/L ratio of the transistors 214 that are on. The equivalent resistance of transistors 214 is increased by decreasing the combined W/L ratio of the transistors 214 that are on.

In the embodiment in which transistors 211 and 214 are binary weighted, calibration control circuit 206 includes an up/down counter circuit. The comparison signal COUT is provided to the up/down control input of the up/down counter circuit in calibration control circuit 206. The up/down counter circuit generates count signals in response to a clock signal CLK and in response to signal COUT. In this embodiment, signals RTX are the count signals generated by the up/down counter circuit in calibration control circuit 206. The up/down counter circuit increases the binary value indicated by the logic states of count signals RTX in response to clock signal CLK and in response to comparison signal COUT being in a logic high state. The up/down counter circuit decreases the binary value indicated by the logic states of count signals RTX in response to clock signal CLK and in response to comparison signal COUT being in a logic low state.

During the calibration of n-channel transistors 214, decoder circuit 207 generates signals NCODE based on signals RTX. During the calibration of p-channel transistors 211, decoder circuit 207 generates signals PCODE based on signals RTX. In the embodiment in which transistors 211 and 214 are binary weighted, and signals RTX are count signals, the more significant bits of signals PCODE and NCODE control the conductive states of the transistors 211 and 214, respectively, having larger W/L channel ratios. Therefore, increasing the binary value of signals NCODE causes the equivalent resistance of n-channel transistors 214 to decrease, and decreasing the binary value of signals NCODE causes the equivalent resistance of n-channel transistors 214 to increase. Increasing the binary value of signals PCODE causes the equivalent resistance of p-channel transistors 211 to decrease, and decreasing the binary value of signals PCODE causes the equivalent resistance of p-channel transistors 211 to increase.

According to another exemplary embodiment, each of the p-channel transistors 211 has the same W/L channel ratio, and each of the n-channel transistors 214 has the same W/L channel ratio. In this embodiment, calibration control circuit 206 may, for example, generate a thermometer code in signals RTX. Calibration control circuit 206 may, for example, generate the thermometer code in signals RTX using a shift register circuit that stores values of the comparison signal COUT in response to clock signal CLK. Decoder circuit 207 uses the thermometer code to control the conductive states of transistors 211 and 214 during the calibration of transistors 211 and 214, respectively.

According to yet another embodiment, calibration control circuit 206 may generate a code in signals RTX that is a hybrid of binary count signals and a thermometer code. According to still another embodiment, calibration control circuit 206 may generate a Gray code in signals RTX.

The n-channel transistors 214 and the p-channel transistors 211 in the enabled unit slice circuits are calibrated at different times during the calibration mode. An example of the calibration of n-channel transistors 214 is now described in further detail. Prior to the calibration of n-channel transistors 214, control signals TIC/TICA-TICN are set to logic states that generate a resistance for adjustable resistance circuit 234 that causes impedance calibration circuit 200 to calibrate the equivalent resistance of transistors 214 to a selected resistance value. The selected resistance value may cause the output resistance of driver circuit 201 to match the characteristic impedance of a transmission link coupled to driver circuit 201 plus or minus any offsets.

Also, prior to the calibration of n-channel transistors 214, one or more of the unit slice circuits in driver circuit 201 are enabled as discussed above, control signal NCE is asserted, and control signal PCE is de-asserted. In response to control signal NCE being asserted, switch circuit 223 is closed, pass gate circuit 235 causes voltage VREF to equal voltage NREF, and polarity switch circuit 204 causes voltages CA and CB to equal voltages DOUT and VREF, respectively, as discussed above. In response to control signal PCE being de-asserted, switch circuits 224-225 are open, as discussed above.

Decoder circuit 207 generates control code signals NCODE based on signals RTX in response to control signal NCE being asserted. In some embodiments, decoder circuit 207 may cause signals NCODE to equal the logic states of signals RTX. Decoder circuit 207 drives all of control code signals PCODE to logic high states to turn off all of p-channel transistors 211 in the enabled unit slice circuits in response to control signal PCE being de-asserted. Also, during the calibration of n-channel transistors 214, signal DINB in each of the enabled unit slice circuits is driven to a logic high state to cause p-channel transistor 212 to be off and n-channel transistor 213 to be on. As a result, during the calibration of n-channel transistors 214, current flows from constant current source 221, through switch circuit 223, through resistor 215, through n-channel transistor 213, and through one or more of n-channel transistors 214 to the node at the ground voltage.

Figure 5A:
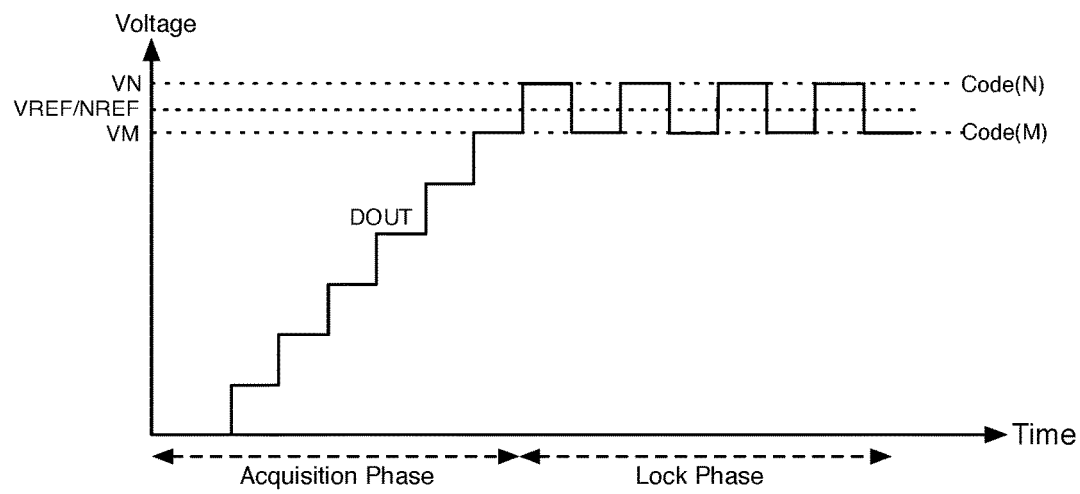
FIGS. 5A-5B are diagrams that show examples of the voltage of the output signal of the driver circuit of FIG. 2 during the calibration of the driver circuit, according to an embodiment of the present invention.

FIG. 5A is a diagram that shows an example of the voltage of output signal DOUT during the calibration of n-channel transistors 214, according to an embodiment of the present invention. During an acquisition phase of the calibration of n-channel transistors 214, calibration control circuit 206 initially sets signals RTX to logic states that cause all of n-channel transistors 214 to be on. When all of transistors 214 are on, the equivalent resistance of transistors 214 is at its minimum value, and the voltage of output signal DOUT is at a low voltage, as shown in FIG. 5A. Comparator circuit 205 compares voltage CA (i.e., DOUT) and voltage CB (i.e., VREF) to generate comparison signal COUT.

Because the voltage of DOUT is initially less than voltage VREF, comparator circuit 205 causes comparison signal COUT to be in a logic low state. In response to the logic low state in signal COUT, calibration control circuit 206 adjusts signals RTX to cause the equivalent resistance of n-channel transistors 214 to increase in each enabled unit slice circuit in driver circuit 201. The voltage of signal DOUT increases in response to the equivalent resistance of n-channel transistors 214 increasing. The voltage of signal DOUT increases in steps during the acquisition phase as shown in FIG. 5A, because the calibration control circuit 206 causes the equivalent resistance of n-channel transistors 214 to increase by an additional amount during each subsequent period of clock signal CLK in response to the logic low state in signal COUT.

A lock phase of the calibration of n-channel transistors 214 begins when the voltage of signal DOUT increases above voltage VREF to voltage VN. In response to the voltage of signal DOUT being greater than voltage VREF, comparator circuit 205 causes signal COUT to be in a logic high state. In response to the logic high state in signal COUT, calibration control circuit 206 adjusts signals RTX to Code(M) in the next period of clock signal CLK to cause the equivalent resistance of n-channel transistors 214 to decrease in each enabled unit slice circuit in driver circuit 201. The voltage of signal DOUT decreases to voltage VM in response to the equivalent resistance of n-channel transistors 214 decreasing in response to Code(M).

Because voltage VM is less than VREF, comparator circuit 205 drives signal COUT to a logic low state again, causing calibration control circuit 206 to adjust signals RTX to Code(N) in the next period of clock signal CLK. In response to signals RTX indicating Code(N), the equivalent resistance of n-channel transistors 214 increases in each enabled unit slice circuit in driver circuit 201, causing the voltage of signal DOUT to increase to voltage VN again. The voltage of signal DOUT oscillates between VN and VM during the lock phase of the calibration of transistors 214, as shown in FIG. 5A.

The calibration of n-channel transistors 214 is complete when the voltage of signal DOUT oscillates between two voltages VN and VM. In an embodiment, calibration control circuit 206 includes a digital filter circuit that may determine when signals RTX oscillate between two values. The digital filter may determine the duration of the lock phase of the calibration of transistors 214. In response to signals RTX oscillating between two values Code(N) and Code(M) for the duration of the lock phase, calibration control circuit 206 selects one of the two values Code(N) or Code(M) as the final calibrated code for n-channel transistors 214. Calibration control circuit 206 then provides the final calibrated code for transistors 214 in signals NCDPMA.

In some embodiments, signals NCDPMA indicate the final calibrated code for n-channel transistors 214 after the calibration of n-channel transistors 214 is complete. Signals NCDPMA may be used to set the equivalent resistance of transistors 214 in each of the unit slice circuits in driver circuit 201 during the transmission mode. Signals NCDPMA may, for example, be used to set the equivalent resistance of n-channel transistors in each driver circuit within the transmitters in one or multiple data channels. In some embodiments, the final calibrated code for the n-channel transistors 214 indicated by signals NCDPMA is provided to one or multiple data channels for transmission in the physical medium attachment (PMA) sublayer of a networking protocol used for an Ethernet standard.

In some embodiments, one or multiple signals NCAL indicate the state of the calibration of n-channel transistors 214. For example, one or more signals NCAL may indicate that the calibration of transistors 214 is beginning, is in progress, or has completed. Control signals TIC may be generated based at least in part on the state of the calibration of transistors 214 as indicated by one or more signals NCAL. In these embodiments, signals NCAL may determine the resistance of adjustable resistor circuit 234, and thus the voltage of signal NREF. Also, one or more signals NCAL are used to generate signals DINB in the enabled unit slice circuits in driver circuit 201 to control the conductive states of transistors 212-213 during the calibration of transistors 214 in these embodiments. Control signal NCE may be one of signals NCAL or may be generated based on one or more of signals NCAL. Thus, signals NCAL may control the functions that are performed based on signal NCE as described herein.

An example of the calibration of p-channel transistors 211 is now described in further detail. Prior to the calibration of p-channel transistors 211, control signals TIC/TICA-TICN are set to logic states that generate a resistance for adjustable resistance circuit 233 that causes the impedance calibration circuit 200 to calibrate the equivalent resistance of transistors 211 to a selected resistance value. The selected resistance value may cause the output resistance of driver circuit 201 to match the characteristic impedance of a transmission link coupled to driver circuit 201 plus or minus any offsets.

Also, prior to the calibration of p-channel transistors 211, one or more of the unit slice circuits in driver circuit 201 are enabled as discussed above, control signal PCE is asserted, and control signal NCE is de-asserted. In response to control signal PCE being asserted, switch circuits 224-225 are closed, and pass gate circuit 235 causes voltage VREF to equal voltage PREF, as discussed above. In response to control signal NCE being de-asserted, switch circuit 223 is open, and polarity switch circuit 204 causes voltages CA and CB to equal the voltages of VREF and DOUT, respectively, as discussed above.

Switch circuit 224 is closed so that constant current source circuit 221 provides current to ground through resistor 226 during the calibration of transistors 211 to prevent coupling that may disturb other constant current source circuits. Also, causing switch circuit 224 to be closed during the calibration of transistors 211 helps to maintain the voltage at node 228 constant so that the voltage of signal DOUT charges faster after the end of the calibration of transistors 211.

Decoder circuit 207 generates control code signals PCODE based on signals RTX in response to control signal PCE being asserted. In some embodiments, decoder circuit 207 may invert signals RTX to generate control code signals PCODE. Decoder circuit 207 drives all of control code signals NCODE to logic low states to turn off all of n-channel transistors 214 in the enabled unit slice circuits in response to control signal NCE being de-asserted. Also, during the calibration of p-channel transistors 211, signal DINB in each of the enabled unit slice circuits is driven to a logic low state to cause p-channel transistor 212 to be on and n-channel transistor 213 to be off. As a result, during the calibration of p-channel transistors 211, current flows from supply voltage VCCA through one or more of p-channel transistors 211, through p-channel transistor 212, through resistor 215, through switch circuit 225, and through constant current source circuit 222 to the node at the ground voltage.

Figure 5B:
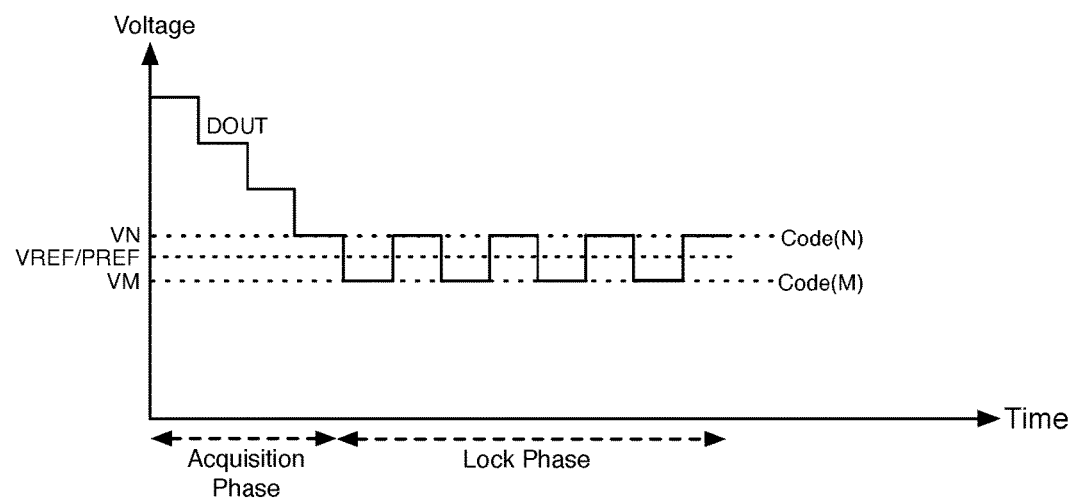

FIG. 5B is a diagram that shows an example of the voltage of output signal DOUT during the calibration of p-channel transistors 211, according to an embodiment of the present invention. In an embodiment, calibration control circuit 206 initially sets signals RTX to the final calibrated code generated for n-channel transistors 214 during an acquisition phase of the calibration of p-channel transistors 211. Setting the initial value of signals RTX to the final calibrated code generated for transistors 214 may reduce the time to calibrate transistors 211. In another embodiment, calibration control circuit 206 initially sets signals RTX to values that cause all of transistors 211 to be on. In response to the initial value of signals RTX during the calibration of transistors 211, decoder 207 generates values for signals PCODE that cause the voltage of output signal DOUT to be greater than voltage VREF/PREF, as shown in FIG. 5B. Comparator circuit 205 compares voltage CA (i.e., VREF/PREF) and voltage CB (i.e., DOUT) to generate comparison signal COUT.

Because the voltage of DOUT is initially greater than voltage VREF, comparator circuit 205 causes comparison signal COUT to be in a logic low state. In response to the logic low state in signal COUT, calibration control circuit 206 adjusts signals RTX to cause the equivalent resistance of p-channel transistors 211 to increase in each enabled unit slice circuit in driver circuit 201. The voltage of signal DOUT decreases in response to the equivalent resistance of p-channel transistors 211 increasing. The voltage of signal DOUT decreases in steps during the acquisition phase as shown in FIG. 5B, because calibration control circuit 206 causes the equivalent resistance of p-channel transistors 211 to increase by an additional amount during each subsequent period of clock signal CLK in response to the logic low state in signal COUT.

A lock phase of the calibration of p-channel transistors 211 begins when the voltage of signal DOUT decreases below voltage VREF to voltage VM. In response to the voltage of signal DOUT being less than voltage VREF, comparator circuit 205 causes signal COUT to be in a logic high state. In response to the logic high state in signal COUT, calibration control circuit 206 adjusts signals RTX to Code(N) in the next period of clock signal CLK to cause the equivalent resistance of p-channel transistors 211 to decrease in each enabled unit slice circuit in driver circuit 201. The voltage of signal DOUT increases to voltage VN in response to the equivalent resistance of p-channel transistors 211 decreasing in response to Code(N).

Because voltage VN is greater than voltage VREF, comparator circuit 205 then drives signal COUT to a logic low state again, causing calibration control circuit 206 to adjust signals RTX to Code(M) in the next period of clock signal CLK. In response to signals RTX indicating Code(M), the equivalent resistance of p-channel transistors 211 increases in each enabled unit slice circuit in driver circuit 201, causing the voltage of signal DOUT to decrease to voltage VM again. The voltage of signal DOUT oscillates between VN and VM during the lock phase of the calibration of transistors 211, as shown in FIG. 5B.

The calibration of p-channel transistors 211 is complete when the voltage of signal DOUT oscillates between two voltages VN and VM. The digital filter in calibration control circuit 206 may determine when signals RTX are oscillating between two values. The digital filter may determine the duration of the lock phase of the calibration of transistors 211. In response to signals RTX oscillating between two values Code(N) and Code(M) for the duration of the lock phase, calibration control circuit 206 selects one of the two values Code(N) or Code(M) as the final calibrated code for p-channel transistors 211. Calibration control circuit 206 then provides the final calibrated code for transistors 211 in signals PCDPMA.

Signals PCDPMA indicate the final calibrated code for p-channel transistors 211 after the calibration of p-channel transistors 211 is complete. Signals PCDPMA may be used to set the equivalent resistance of transistors 211 in each of the unit slice circuits in driver circuit 201 during the transmission mode. Signals PCDPMA may, for example, be used to set the equivalent resistance of p-channel transistors in each driver circuit within transmitters in one or multiple data channels. In some embodiments, the final calibrated code for the p-channel transistors 211 indicated by signals PCDPMA is provided to one or multiple data channels for transmission in the PMA sublayer of a networking protocol used for an Ethernet standard.

In some embodiments, one or multiple signals PCAL indicate the state of the calibration of p-channel transistors 211. For example, one or more signals PCAL may indicate that the calibration of transistors 211 is beginning, is in progress, or has completed. Control signals TIC may be generated based at least in part on the state of the calibration of transistors 211 as indicated by one or more signals PCAL. In these embodiments, signals PCAL may determine the resistance of adjustable resistor circuit 233, and thus the voltage of signal PREF. Also, one or more signals PCAL are used to generate signals DINB in the enabled unit slice circuits in driver circuit 201 to control the conductive states of transistors 212-213 during the calibration of transistors 211 in these embodiments. Control signal PCE may be one of signals PCAL or may be generated based on one or more of signals PCAL. Thus, signals PCAL may control the functions that are performed based on signal PCE as described herein.

Figure 6:
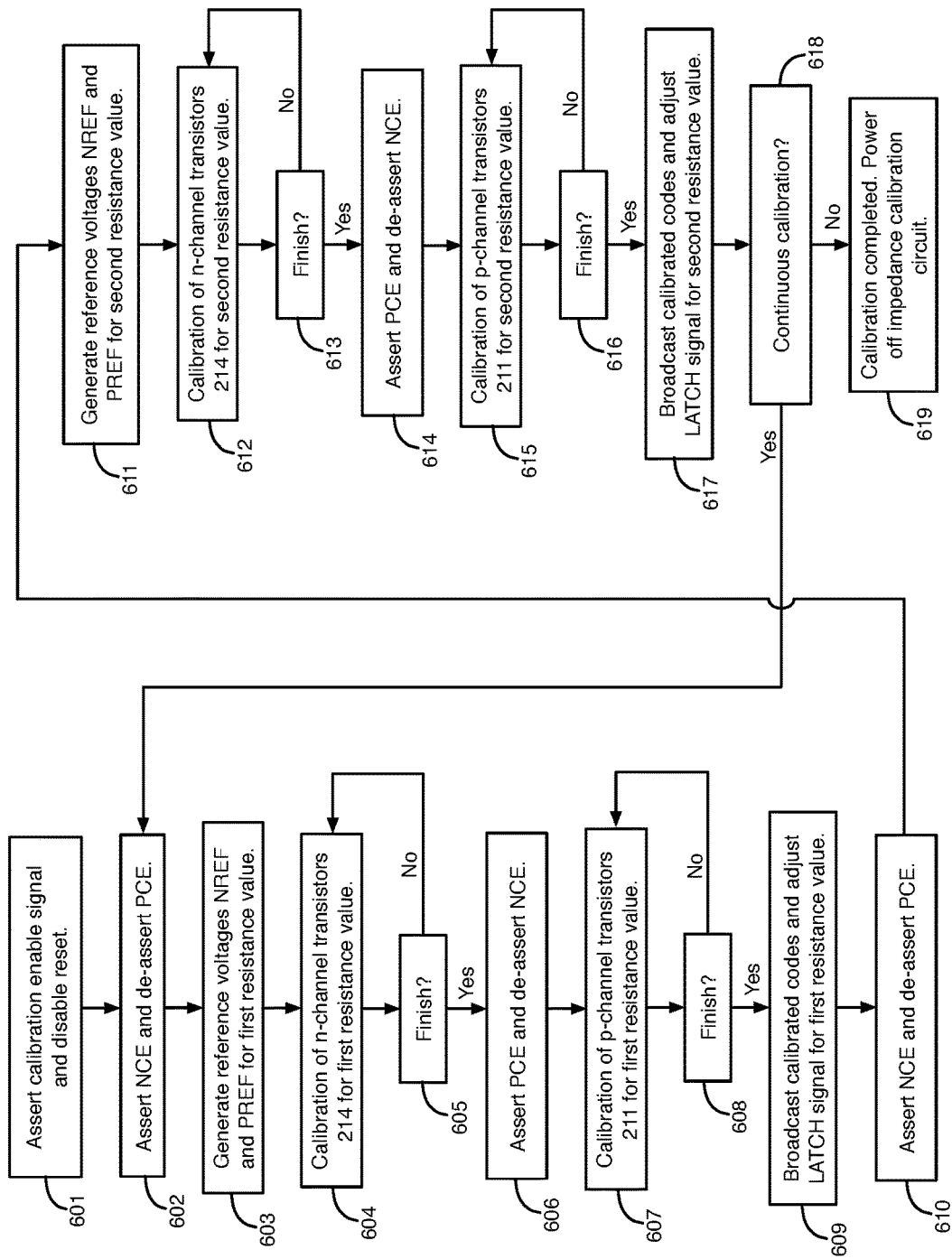
FIG. 6 illustrates examples of operations for calibrating the resistance of the driver circuit of FIG. 2 to multiple resistance values, according to an embodiment of the present invention.

FIG. 6 illustrates examples of operations for calibrating the output resistance of driver circuit 201 to multiple resistance values, according to an embodiment of the present invention. In operation 601, the calibration of the output resistance of driver circuit 201 begins when a calibration enable signal CALEN is asserted, and a reset signal that resets calibration control circuit 206 is disabled. The reset signal is generated by a synchronous reset circuit based on the CALEN signal. In operation 602, calibration control circuit 206 asserts the NCE signal and de-asserts or disables the PCE signal.

In operation 603, calibration control circuit 206 generates a first set of logic states in control signals TIC that cause reference voltage generator circuit 203 to generate a reference voltage NREF for a first resistance value. The first resistance value may be any resistance value. The first resistance value may be selected to cause the output resistance of driver circuit 201 to match the characteristic impedance (e.g., 100 ohms) of a first transmission link coupled to driver circuit 201 during a first transmission mode. The reference voltage NREF for the first resistance value is selected to cause the impedance calibration circuit 200 to calibrate the equivalent resistance of n-channel transistors 214 to the first resistance value. Also in operation 603, the first set of logic states in control signals TIC generated by calibration control circuit 206 cause reference voltage generator circuit 203 to generate a reference voltage PREF for the first resistance value. The reference voltage PREF for the first resistance value is selected to cause the impedance calibration circuit 200 to calibrate the equivalent resistance of p-channel transistors 211 to the first resistance value.

In operation 604, impedance calibration circuit 200 calibrates n-channel transistors 214 to the first resistance value during a first calibration mode. During operation 604, impedance calibration circuit 200 causes the equivalent resistance of transistors 214 to equal or approximately equal the first resistance value. The calibration of transistors 214 may be performed as described above with respect to FIGS. 2 and 5A-5B. In operation 605, calibration control circuit 206 determines if the calibration of transistors 214 is finished. The calibration of transistors 214 is finished when the equivalent resistance of transistors 214 equals or approximately equals the first resistance value. If the calibration of transistors 214 is not finished, impedance calibration circuit 200 continues to calibrate the equivalent resistance of transistors 214 to the first resistance value in operation 604. If the calibration of transistors 214 is finished, then impedance calibration circuit 200 proceeds to operation 606.

In operation 606, the calibration of p-channel transistors 211 begins when calibration control circuit 206 asserts the PCE signal and de-asserts the NCE signal. In operation 607, impedance calibration circuit 200 calibrates p-channel transistors 211 to the first resistance value during the first calibration mode. During operation 607, impedance calibration circuit 200 causes the equivalent resistance of transistors 211 to equal or approximately equal the first resistance value. The calibration of transistors 211 may be performed as described above with respect to FIGS. 2 and 5A-5B. In operation 608, calibration control circuit 206 determines if the calibration of transistors 211 is finished. The calibration of transistors 211 is finished when the equivalent resistance of transistors 211 equals or approximately equals the first resistance value. If the calibration of transistors 211 is not finished, impedance calibration circuit 200 continues to calibrate the equivalent resistance of transistors 211 to the first resistance value in operation 607. If the calibration of transistors 211 is finished, then impedance calibration circuit 200 proceeds to operation 609.

In operation 609, calibration control circuit 206 broadcasts final calibrated codes for the first resistance value in signals PCDPMA for the p-channel transistors 211 and in signals NCDPMA for the n-channel transistors 214 to one or more data channels. Signals PCDPMA and NCDPMA may be used to set the output resistances of one or more driver circuits in one or more data channels. In the embodiment of FIG. 6, calibration control circuit 206 generates one LATCH signal. In operation 609, calibration control circuit 206 adjusts the LATCH signal to a first value that indicates that the values of signals PCDPMA and NCDPMA identify the final calibrated codes for the first resistance value. The data channels operating according to data transmission protocols that require the first resistance value adjust the output resistances of their driver circuits based on signals PCDPMA and NCDPMA in response to the LATCH signal having the first value.

In operation 610, calibration control circuit 206 asserts the NCE signal and de-asserts the PCE signal. In operation 611, calibration control circuit 206 generates a second set of logic states in control signals TIC that cause reference voltage generator circuit 203 to generate a reference voltage NREF for a second resistance value. The second resistance value may be any resistance value that is different than the first resistance value. The second resistance value may be selected to cause the output resistance of driver circuit 201 to match the characteristic impedance (e.g., 85 ohms) of a second transmission link coupled to driver circuit 201 during a second transmission mode. The reference voltage NREF for the second resistance value is selected to cause the impedance calibration circuit 200 to calibrate the equivalent resistance of n-channel transistors 214 to the second resistance value. Also in operation 611, the second set of logic states in control signals TIC generated by calibration control circuit 206 cause reference voltage generator circuit 203 to generate a reference voltage PREF for the second resistance value. The reference voltage PREF for the second resistance value is selected to cause the impedance calibration circuit 200 to calibrate the equivalent resistance of p-channel transistors 211 to the second resistance value.

In operation 612, impedance calibration circuit 200 calibrates n-channel transistors 214 for the second resistance value during a second calibration mode. During operation 612, impedance calibration circuit 200 causes the equivalent resistance of transistors 214 to equal or approximately equal the second resistance value. The calibration of transistors 214 may be performed as described above with respect to FIGS. 2 and 5A-5B. In operation 613, calibration control circuit 206 determines if the calibration of transistors 214 is finished. The calibration of transistors 214 is finished when the equivalent resistance of transistors 214 equals or approximately equals the second resistance value. If the calibration of transistors 214 is not finished, impedance calibration circuit 200 continues to calibrate the equivalent resistance of transistors 214 to the second resistance value in operation 612. If the calibration of transistors 214 is finished, then impedance calibration circuit 200 proceeds to operation 614.

In operation 614, the calibration of p-channel transistors 211 begins when calibration control circuit 206 asserts the PCE signal and de-asserts the NCE signal. In operation 615, impedance calibration circuit 200 calibrates p-channel transistors 211 for the second resistance value during the second calibration mode. During operation 615, impedance calibration circuit 200 causes the equivalent resistance of transistors 211 to equal or approximately equal the second resistance value. The calibration of transistors 211 may be performed as described above with respect to FIGS. 2 and 5A-5B. In operation 616, calibration control circuit 206 determines if the calibration of transistors 211 is finished. The calibration of transistors 211 is finished when the equivalent resistance of transistors 211 equals or approximately equals the second resistance value. If the calibration of transistors 211 is not finished, impedance calibration circuit 200 continues to calibrate the equivalent resistance of transistors 211 to the second resistance value in operation 615. If the calibration of transistors 211 is finished, then impedance calibration circuit 200 proceeds to operation 617.

In operation 617, calibration control circuit 206 broadcasts final calibrated codes for the second resistance value in signals PCDPMA for the p-channel transistors 211 and in signals NCDPMA for the n-channel transistors 214 to one or more data channels. Also in operation 617, calibration control circuit 206 adjusts the LATCH signal to a second value that indicates that the values of signals PCDPMA and NCDPMA identify the final calibrated codes for the second resistance value. The data channels operating according to data transmission protocols that require the second resistance value adjust the output resistances of their driver circuits based on signals PCDPMA and NCDPMA in response to the LATCH signal having the second value.

After operation 617, impedance calibration circuit 200 proceeds to operation 618. In operation 618, calibration control circuit 206 determines if continuous calibration is to be performed on n-channel transistors 214 and p-channel transistors 211 for the first and second resistance values. Impedance calibration circuit 200 can, for example, perform continuous calibration of the equivalent resistances of transistors 211 and 214 to compensate for changes in the temperature of driver circuit 201. If continuous calibration is to be performed on transistors 214 and 211 for the first and second resistance values, the process of FIG. 6 is repeated by returning to operation 602. If continuous calibration is not to be performed on transistors 214 and 211, then calibration is complete, and the impedance calibration circuit 200 is powered off in operation 619. Thus, impedance calibration circuit 200 supports one time calibration and continuous calibration of the equivalent resistances of transistors 211 and 214.

According to additional embodiments, impedance calibration circuit 200 can calibrate the equivalent resistances of transistors 211 and 214 to three or more resistance values. For example, impedance calibration circuit 200 may calibrate the equivalent resistances of transistors 211 and 214 for a 100 ohm transmission link during a first calibration mode, for an 85 ohm transmission link during a second calibration mode, for a 98 ohm transmission link during a third calibration mode, and for an 83 ohm transmission link during a fourth calibration mode. In these embodiments, calibration control circuit 206 generates multiple LATCH signals.

Impedance calibration circuit 200 also has the capability to digitally offset the final calibrated codes for p-channel transistors 211 and n-channel transistors 214. Calibration control circuit 206 receives signals PCOF that indicate a digital offset to provide to the final calibrated code for p-channel transistors 211. Calibration control circuit 206 adjusts the final calibrated code as indicated by signals PCDPMA based on the digital offset indicated by signals PCOF. Calibration control circuit 206 receives signals NCOF that indicate a digital offset to provide to the final calibrated code for n-channel transistors 214. Calibration control circuit 206 adjusts the final calibrated code as indicated by signals NCDPMA based on the digital offset indicated by signals NCOF. The digital offsets indicated by signals PCOF and NCOF are provided to one, a subset, or all of the data channels via adjustments to signals PCDPMA and NCDPMA. As an example, calibration control circuit 206 may shift the bits of the final calibrated codes left or right based on the digital offsets.

Impedance calibration circuit 200 also has the capability to provide analog offsets to the final calibrated codes for p-channel transistors 211 and n-channel transistors 214. Calibration control circuit 206 receives signals PROF that indicate an analog offset to provide to p-channel transistors 211. Calibration control circuit 206 receives signals NROF that indicate an analog offset to provide to n-channel transistors 214. Calibration control circuit 206 adjusts control signals TIC based on the analog offsets indicated by signals PROF and NROF. Thus, calibration control circuit 206 controls the reference voltages PREF and NREF generated by circuit 203 based at least in part on signals PROF and NROF. Reference voltage generator circuit 203 adjusts the reference voltages PREF and NREF, and therefore adjusts the analog offsets, based on changes in the process, the supply voltage, and the temperature (PVT) of circuit 200, as described above.

Figure 7:
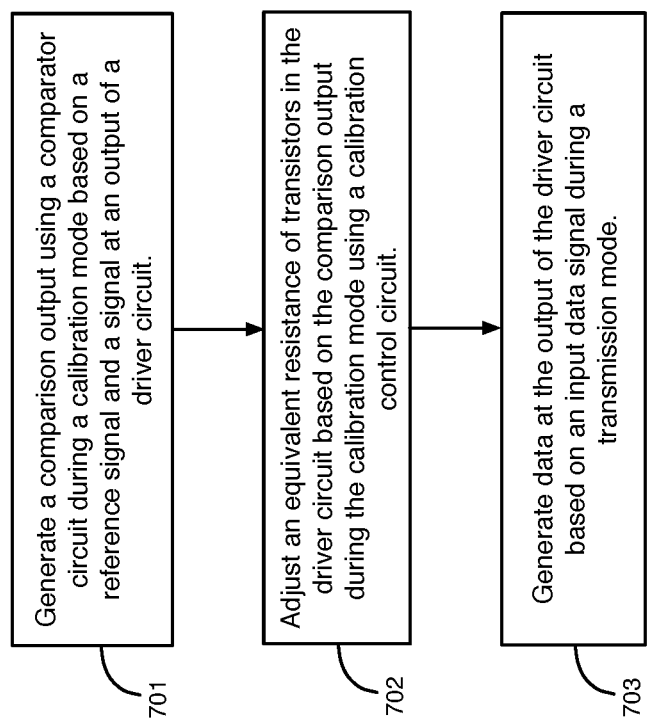
FIG. 7 illustrates examples of operations that may be performed by the impedance calibration circuit of FIG. 2, according to an embodiment of the present invention.

FIG. 7 illustrates examples of operations that may be performed by impedance calibration circuit 200, according to an embodiment of the present invention. In operation 701, comparator circuit 205 generates a comparison output during a calibration mode based on a reference signal and a signal at an output of driver circuit 201. In operation 702, calibration control circuit 206 adjusts an equivalent resistance of transistors in driver circuit 201 based on the comparison output during the calibration mode. In operation 703, driver circuit 201 generates data at the output of driver circuit 201 based on an input data signal during a transmission mode.

Figure 8:
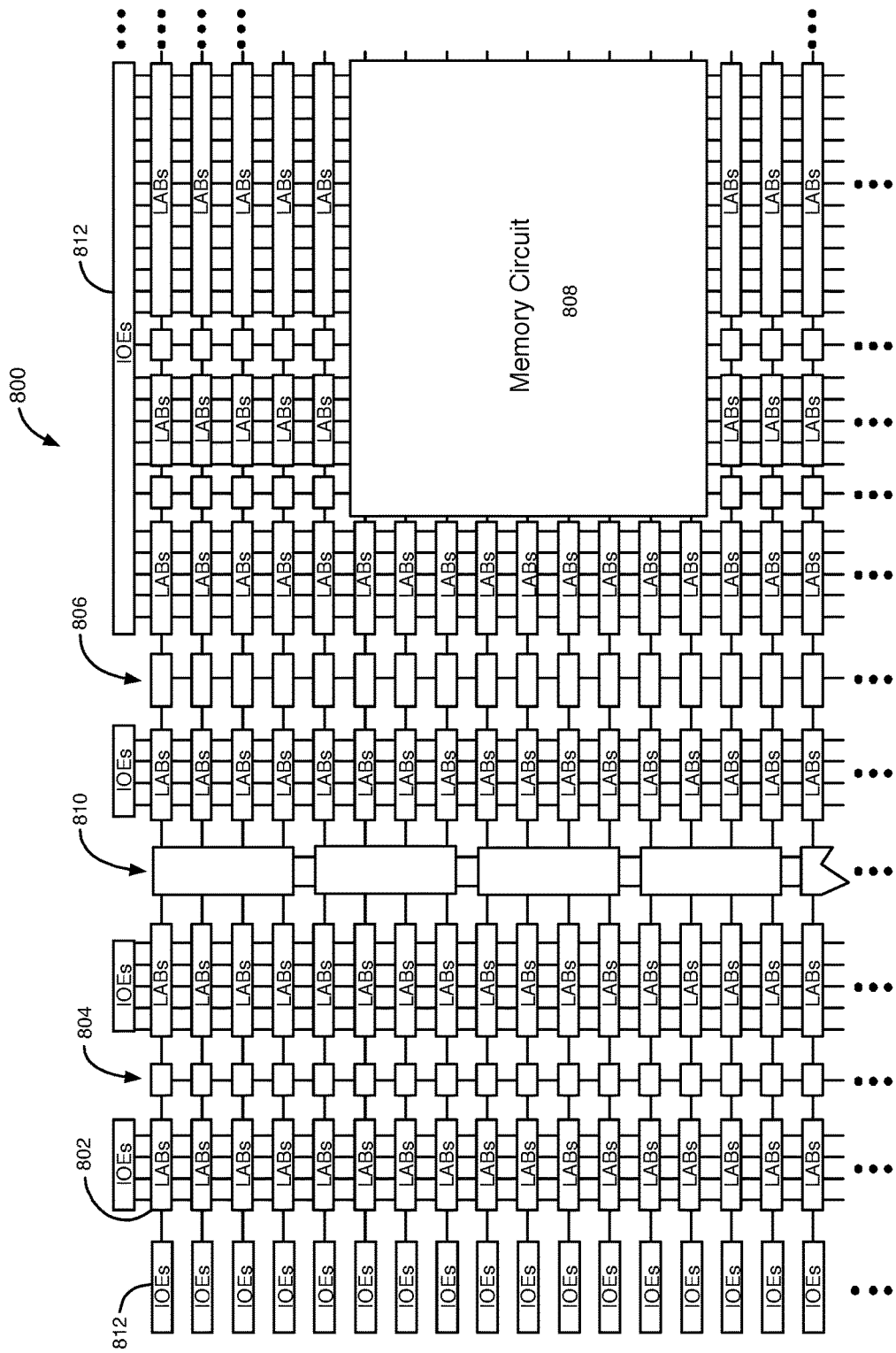
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include several logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure of interconnect conductors. The programmable interconnect structure can be programmed to interconnect the logic elements in almost any desired configuration.

FPGA 800 may also include a distributed memory structure including random access memory (RAM) circuits of varying sizes provided throughout the array. The RAM circuits include, for example, circuits 804, circuits 806, and circuit 808. These memory circuits can also include shift registers and first-in first-out (FIFO) circuits.

FPGA 800 may further include digital signal processing (DSP) circuits 810 that can implement, for example, multipliers with add or subtract features. Input/output elements (IOEs) 812 support numerous single-ended and differential input/output standards. One or more of IOEs 812 may include an impedance calibration circuit 200. IOEs 812 may include receiver circuits and transmitter circuits. The transmitter and receiver circuits are coupled to pads of the integrated circuit. The pads are external terminals of the FPGA die that can be used to route, for example, input signals, output signals, and supply voltages between the FPGA and one or more external devices. FPGA 800 is described herein for illustrative purposes. Embodiments of the present invention can be implemented in many different types of integrated circuits.

Figure 9:
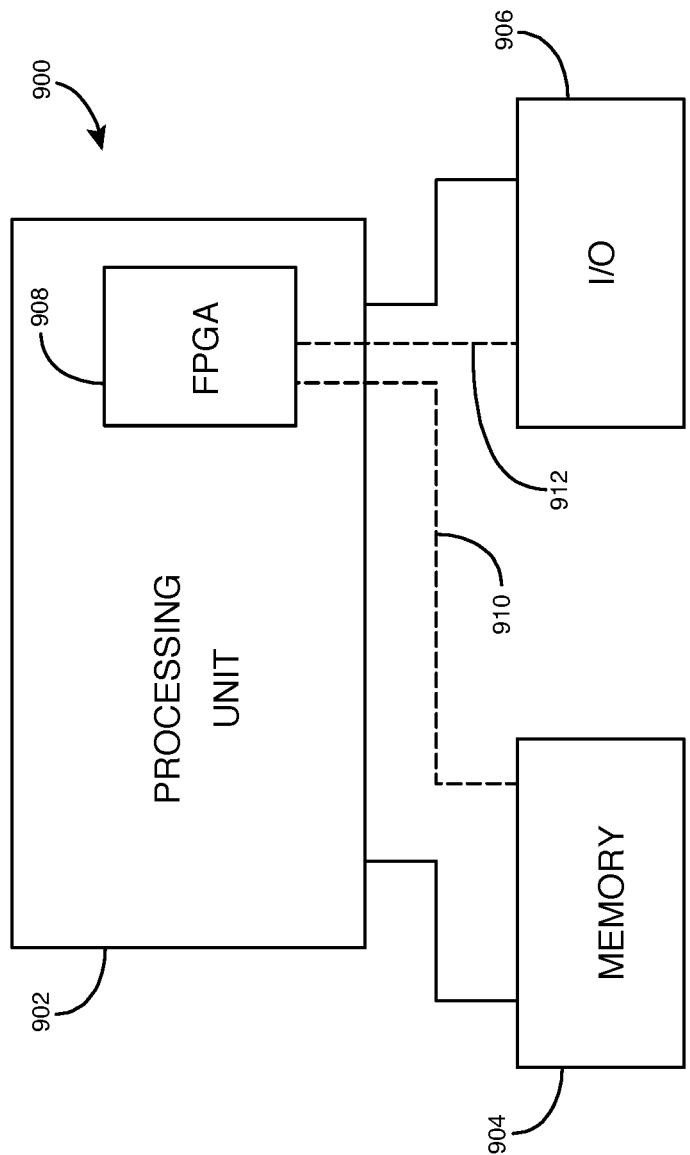
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a driver circuit that drives data to an output based on an input data signal in a transmission mode, wherein the driver circuit comprises first transistors;
a comparator that generates a comparison output in a calibration mode based on a reference signal and a signal at the output of the driver circuit;
a calibration control circuit that adjusts an equivalent resistance of the first transistors based on the comparison output in the calibration mode; and
a calibration current circuit comprising a first constant current source circuit and a first switch circuit, wherein the first switch circuit is coupled between the first constant current source circuit and the output of the driver circuit.

2. The circuit of claim 1, further comprising:
a reference voltage generator circuit that generates the reference signal, wherein the reference voltage generator circuit comprises a first current source circuit that generates a first tracking current to track temperature and process variations, a second current source circuit that generates a second tracking current to track temperature and process variations, and a pass gate circuit coupled to the first and the second current source circuits.

3. The circuit of claim 2, further comprising:
a polarity switch circuit coupled to inputs of the comparator, coupled to the calibration current circuit, and coupled to the reference voltage generator circuit.

4. The circuit of claim 1, wherein the calibration current circuit further comprises a second constant current source circuit, a second switch circuit, a third switch circuit, and a resistor, wherein the first switch circuit is coupled to the second switch circuit, wherein the second switch circuit is coupled to the second constant current source circuit, and wherein the third switch circuit is coupled to the first constant current source circuit and to the resistor.

5. The circuit of claim 1, wherein the driver circuit comprises second transistors, a third transistor coupled to the second transistors, and a fourth transistor coupled to the third and the first transistors, wherein the third and the fourth transistors drive the data to the output based on the input data signal in the transmission mode, and wherein the calibration control circuit adjusts an equivalent resistance of the second transistors based on the comparison output in the calibration mode.

6. The circuit of claim 5 further comprising:
a decoder circuit that generates first control signals for adjusting the equivalent resistance of the first transistors in response to a second control signal generated by the calibration control circuit being asserted, wherein the decoder circuit generates third control signals for adjusting the equivalent resistance of the second transistors in response to a fourth control signal generated by the calibration control circuit being asserted.

7. The circuit of claim 6, wherein the decoder circuit generates the first and the third control signals based on fifth control signals generated by the calibration control circuit in response to the comparison output in the calibration mode.

8. A circuit comprising:
a driver circuit that provides data to an output based on an input data signal in a transmission mode;
a comparator that generates a comparison output in a calibration mode based on a comparison between a reference signal and a signal at the output of the driver circuit;
a calibration control circuit that adjusts a resistance in the driver circuit based on the comparison output in the calibration mode; and
a reference voltage generator circuit that generates the reference signal, wherein the reference voltage generator circuit comprises a first current source circuit that generates a first tracking current to track temperature and process variations, a second current source circuit that generates a second tracking current to track temperature and process variations, and a pass gate circuit coupled to the first and the second current source circuits.

9. The circuit of claim 8, wherein the reference voltage generator circuit further comprises first and second adjustable resistance circuits, wherein the first current source circuit is coupled to the first adjustable resistance circuit, and wherein the second current source circuit is coupled to the second adjustable resistance circuit.

10. The circuit of claim 8, further comprising:
a polarity switch circuit coupled to inputs of the comparator, coupled to the driver circuit, and coupled to the reference voltage generator circuit.

11. The circuit of claim 8, wherein the driver circuit comprises first and second transistors, a third transistor coupled to the second transistors, and a fourth transistor coupled to the third and the first transistors, wherein the third and the fourth transistors drive the data to the output based on the input data signal in the transmission mode, and wherein the calibration control circuit adjusts an equivalent resistance of the first transistors and an equivalent resistance of the second transistors based on the comparison output in the calibration mode.

12. The circuit of claim 11, further comprising:
a decoder circuit that generates first control signals for adjusting the equivalent resistance of the first transistors in response to a second control signal generated by the calibration control circuit being asserted, wherein the decoder circuit generates third control signals for adjusting the equivalent resistance of the second transistors in response to a fourth control signal generated by the calibration control circuit being asserted.

13. The circuit of claim 12, wherein the decoder circuit generates the first and the third control signals based on fifth control signals generated by the calibration control circuit in response to the comparison output in the calibration mode.

14. The circuit of claim 8, further comprising:
a calibration current circuit comprising a constant current source circuit and a switch circuit, wherein the switch circuit is coupled between the constant current source circuit and the output of the driver circuit.

15. A method comprising:
generating data at an output of a driver circuit based on an input data signal during a transmission mode;
generating a comparison output using a comparator circuit during a calibration mode based on a comparison between a reference signal and a signal at the output of the driver circuit;
adjusting an equivalent resistance of first transistors in the driver circuit based on the comparison output during the calibration mode using a calibration control circuit;
providing a first voltage to the reference signal during a first portion of the calibration mode using a pass gate circuit and a first current source circuit that generates a first tracking current to track temperature and process variations; and
providing a second voltage to the reference signal during a second portion of the calibration mode using the pass gate circuit and a second current source circuit that generates a second tracking current to track temperature and process variations, wherein the pass gate circuit is coupled to the first and the second current source circuits.

16. The method of claim 15, wherein a first input of the pass gate circuit is coupled to the first current source circuit, and wherein a second input of the pass gate circuit is coupled to the second current source circuit.

17. The method of claim 15, further comprising:
changing a polarity of inputs to the comparator circuit using a polarity switch circuit coupled to the driver circuit and to the pass gate circuit.

18. The method of claim 15, further comprising:
varying the first voltage by changing a resistance of a first adjustable resistance circuit; and
varying the second voltage by changing a resistance of a second adjustable resistance circuit.

19. The method of claim 15, further comprising:
adjusting an equivalent resistance of second transistors in the driver circuit based on the comparison output during the calibration mode using the calibration control circuit,
wherein generating data at an output of a driver circuit based on an input data signal during a transmission mode further comprises generating the data at the output of the driver circuit based on the input data signal during the transmission mode using third and fourth transistors, wherein the third transistor is coupled to the second transistors, and wherein the fourth transistor is coupled to the third transistor and to the first transistors.

20. The method of claim 19, further comprising:
generating first control signals using a decoder circuit for adjusting the equivalent resistance of the first transistors in response to a second control signal generated by the calibration control circuit being asserted; and
generating third control signals using the decoder circuit for adjusting the equivalent resistance of the second transistors in response to a fourth control signal generated by the calibration control circuit being asserted.

* * * * *